United States Patent [19]

Sakata

[11] Patent Number: 5,756,373
[45] Date of Patent: May 26, 1998

[54] METHOD FOR FABRICATING OPTICAL SEMICONDUCTOR DEVICE

[75] Inventor: Yasutaka Sakata, Tokyo, Japan

[73] Assignee: NEC Corporation, Tokyo, Japan

[21] Appl. No.: 625,196

[22] Filed: Apr. 1, 1996

[30] Foreign Application Priority Data

Mar. 31, 1995 [JP] Japan .................................. 7-075112

[51] Int. Cl.$^6$ .................................................. H01L 21/20
[52] U.S. Cl. .................................................. 438/35; 438/24
[58] Field of Search .................................. 437/126, 129, 437/133; 148/DIG. 95, DIG. 10; 438/35, 34

[56] References Cited

U.S. PATENT DOCUMENTS

| | | | |
|---|---|---|---|
| 4,077,817 | 3/1978 | Bellavance | 437/129 |
| 4,114,257 | 9/1978 | Bellavance | 437/129 |
| 4,961,198 | 10/1990 | Ishino et al. | 372/50 |
| 5,382,543 | 1/1995 | Nakamura et al. | 437/129 |
| 5,436,195 | 7/1995 | Kimura et al. | 437/129 |
| 5,450,437 | 9/1995 | Shim et al. | 437/129 |
| 5,580,818 | 12/1996 | Sakata | 437/129 |

FOREIGN PATENT DOCUMENTS 5243551  9/1993  Japan .

OTHER PUBLICATIONS

Sasaki et al, "Optical Quantum Device Research Forum of Institute of Electrical Engineers", WDM, Document No. OQD-90-64, Dec. 12, 1990.

Masahiro Aoki et al, "InGaAs/InGaAsP MQW Electroabsorption Modulator Integrated with a DFB Laser Fabricated by Band-Gap Energy Control Selective Area MOCVD", *IEEE Journal of Quantum Electronics*, vol. 29, No. 6, Jun. 1993.

*Primary Examiner*—Kevin Picardat
*Attorney, Agent, or Firm*—Sughrue, Mion, Zinn, Macpeak & Seas, PLLC

[57] ABSTRACT

In a fabricating method of an optical semiconductor device, a pair of $SiO_2$ films are formed on an n-InP substrate so as to have a large width in a region I (laser region) and a small width in a region II (optical waveguide region) and have the same gap interval therebetween in the regions I and II, and then an InGaAsP optical guide layer, a MQW (multiquantum well) active layer comprising InGaAsP quantum well layers and InGaAsP barrier layers, and a p-InP layer are selectively grown by MOVPE (metal-organic vapor phase epitaxial growth) method, whereby compressive lattice strain is introduced in the InGaAsP quantum well layers of the region I, and tensile lattice strain is introduced in the InGaAsP quantum well layers of the region II.

18 Claims, 12 Drawing Sheets

401: n-InP SUBSTRATE
402: SiO₂ FILM

METHOD FOR FABRICATING OPTICAL SEMICONDUCTOR DEVICE

BACKGROUND OF THE INVENTION

1. Field of the Invention

The present invention relates to a method for fabricating an optical semiconductor device, and particularly to a method of fabricating an optical semiconductor device by integrating an LD (laser diode) and an optical waveguide on the same substrate with high optical coupling efficiency.

2. Description of Related Art

Optical semiconductor elements, represented by semiconductor lasers, semiconductor optical modulators, semiconductor optical switches, semiconductor optical waveguides, etc., have been actively studied and developed on application thereof to various optical fields such as optical fiber communication, optical measurement, optical exchange, etc. Recently, a monolithically integrated optical semiconductor device has attracted much attention because it can be designed in compact size and low cost and enables great enhancement in optical coupling efficiency between elements to reduce power demand.

Further, a wavelength division multiplexing (WDM) communication system has been also actively studied and developed because it enables communication capacity to be greatly enlarged by using an existing optical fiber network. In order to achieve this system, plural semiconductor laser beams which are emitted at different wavelengths are required to be incident to a single optical fiber. Further, in order to apply this system to a monolithic optical semiconductor device, the plural laser beams are required to be joined in a single optical waveguide, and coupled to the optical fiber. In this case, it is necessary that a transmission loss of the optical waveguide is sufficiently reduced to reduce driving current of each laser and thus reduce power demand.

The device structure and fabricating method of conventional optical semiconductor devices in which a semiconductor laser and an optical waveguide is monolithically integrated on the same substrate will be described hereunder.

Figure 1:
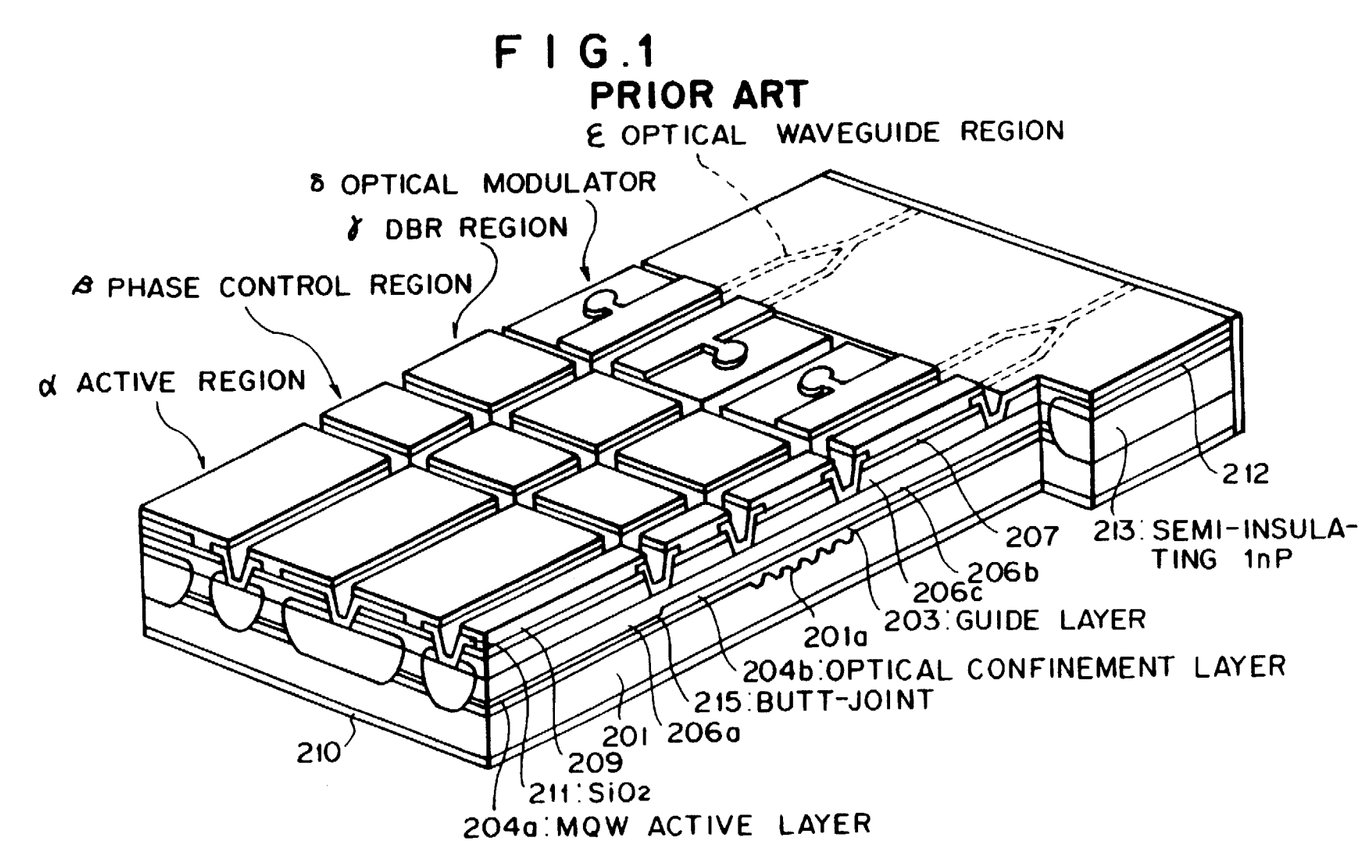
FIG. 1 is a perspective view showing an optical semiconductor device disclosed in a first prior art.

FIG. 1 is a perspective view showing the device structure of a semiconductor integrated device for WDM (document no. OQD-90-64 on Dec. 12, 1990), which was reported by Sasaki, et al. in "Optical Quantum Device Research Forum of Institute of Electrical Engineers" (hereinafter referred to as "first prior art"). The first prior art discloses an integrated light source which comprises distributed reflection type (DBR) lasers (α, β, γ), an optical modulator δ and an optical waveguide ε.

The fabricating method of the semiconductor integrated device of the first prior art will be described below with reference to FIGS. 2A to 3C.

Figure 2A:
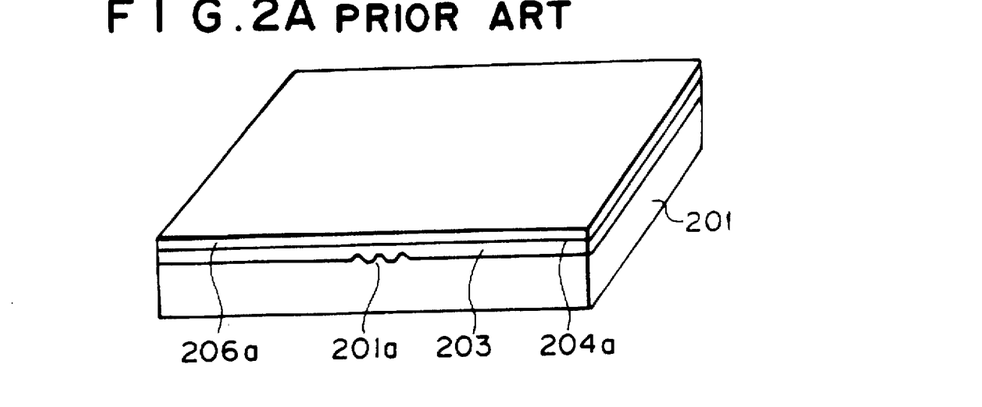
FIGS. 2A to 2C are perspective views showing a series of processes for fabricating the optical semiconductor device of FIG. 1.
Figure 2B:
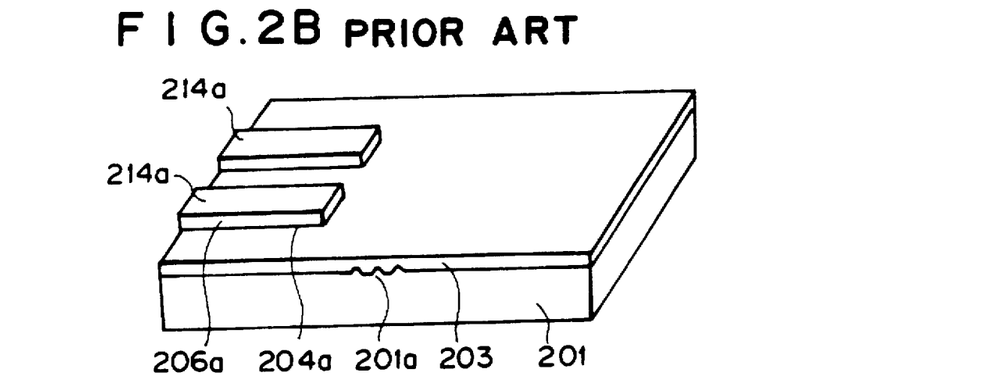

As shown in FIG. 2A, a grating 201a is formed partially on an n-InP substrate 201, and then an n-InGaAsP (λg=1.3 µm) layer 203, an n-InP spacer layer (not shown), a multi-quantum well (MQW) structure 204a and a p-InP cladding layer 206a are formed on the substrate 201 by a metal-organic vapor phase epitaxial growth method (MOVPE method). In the above description, the quaternary compound semiconductor layer which consists of In, Ga, As and P, has a band gap of λgb=1.3 µm and is lattice-matched with InP, is represented as InGaAsP (λgb=1.3 µm) by using a wavelength expression style. In the following description, in place of an expression style based on composition, a brief expression style using λg is used. If not specified otherwise, an epitaxial layer which is lattice-matched with InP within ±0.05% of lattice strain is assumed to be used.

Figure 2C:
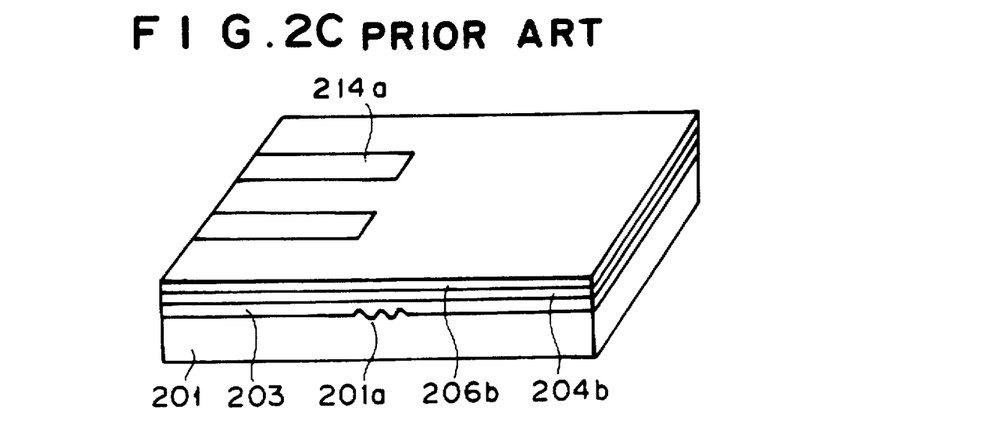
Figure 3A:
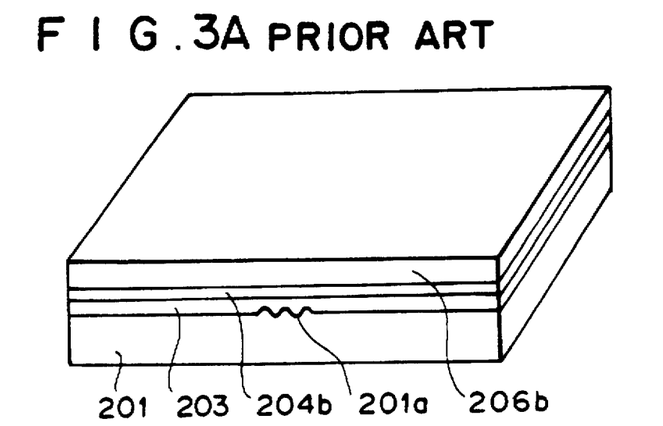
FIGS. 3A to 3C are perspective views showing a subsequent series of processes for fabricating the optical semiconductor device of FIG. 1.

Subsequently, SiO₂ films 214a are formed on areas which will serve as laser active regions, and an etching process is conducted on the substrate by using the SiO₂ films 214a as a mask to expose the n-InGaAsP (λgb=1.3 µm) layer 203. Thereafter, an n-InP layer (not shown), a non-dope InGaAsP light absorption layer 204b (λgb=1.35 µm), and a p-InP cladding layer 206b are formed by the MOVPE method as shown in FIG. 2C to form a butt-joint 215. Subsequently, the SiO₂ films 214a are removed, then a p-InP layer is grown by a liquid phase epitaxial growth method (LPE method) or the MOVPE method, and then the result is flattened as shown in FIG. 3A.

Figure 3B:
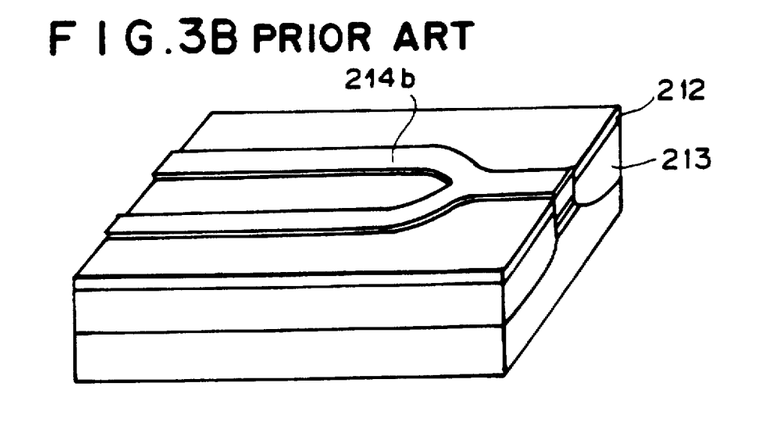
Figure 3C:
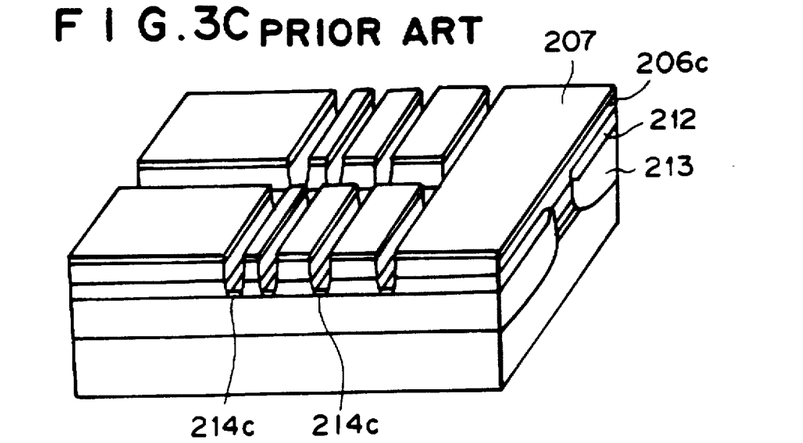

Thereafter, an SiO₂ film 214b is formed, then a mesa-etching process is conducted by using the SiO₂ film 214b as a mask, and then an Fe-doped high-resistance InP layer 213 and an n-InP layer 212 are selectively re-grown by the MOVPE method as shown in FIG. 3B (embedding re-growth process). Subsequently, in order to electrically separate elements from one another, the n-InP layer 212 between respective regions and between channels is removed as shown in FIG. 3C, and finally growth-prohibiting masks 214c of SiO₂ are formed between the respective regions and between the channels by a patterning process, and then a p-InP cladding layer 206c and a p-InGaAsP (λgb=1.67 µm) cap layer 207 are selectively formed in an islandish form by the MOVPE method.

As described above, in the fabricating process of the semiconductor device as described above, the regions having different band-gap wavelengths are formed on the same plane while coupled to one another through the butt-joint 215, and thus complicated selective etching and selective re-growth processes are required. Therefore, it is difficult to keep sufficient controllability and fabricate an excellent structure with high reproducibility. In addition, the optical coupling efficiency at the butt-joint 215 cannot be enhanced to about 80% or more.

Under such a situation, Aoki, et al. has reported and proposed a method of fabricating an integrated type optical semiconductor device in which an optical waveguide over two regions is formed through only a single epitaxial growth process by using an MOVPE selective growth technique without the selective etching and selective re-growth processes, and this method is described as "NOVEL STRUCTURE MQW ELECTROABSORPTION MODULATOR/DBF-LASER INTEGRATED DEVICE FABRICATED BY SELECTIVE AREA MOCVD GROWTH" in "ELECTRONICS LETTERS", Vol.27, No. 23, pp 2138–2140 issued in 1991, or in Japanese Laid-open Patent Application NO. Hei-5-243551 (hereinafter referred to as "second prior art").

The fabrication method as disclosed in the second prior art will be described with reference to FIGS. 4A to 4C.

Figure 4A:
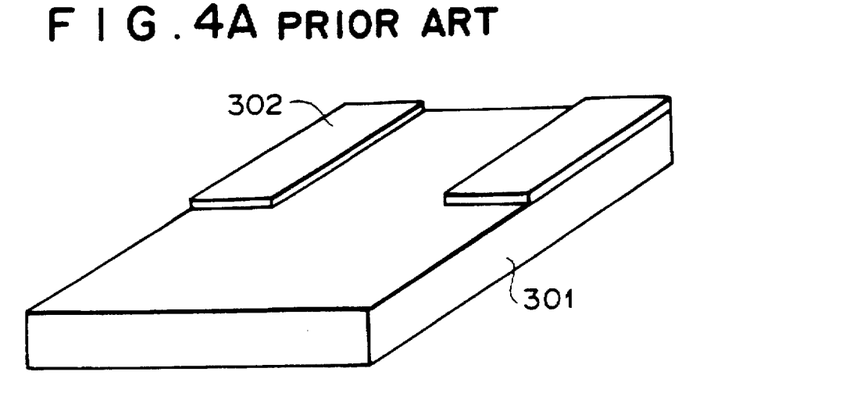
FIGS. 4A and 4B are perspective views showing a fabricating process as disclosed in a second prior art.
Figure 4B:
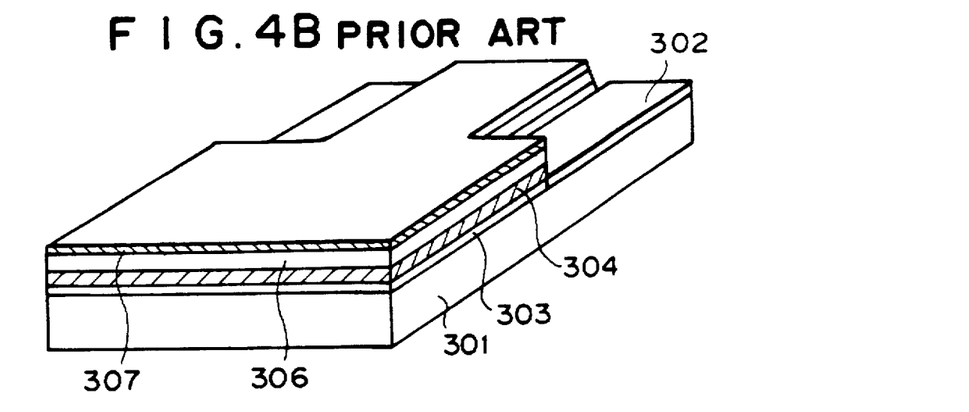
Figure 4C:
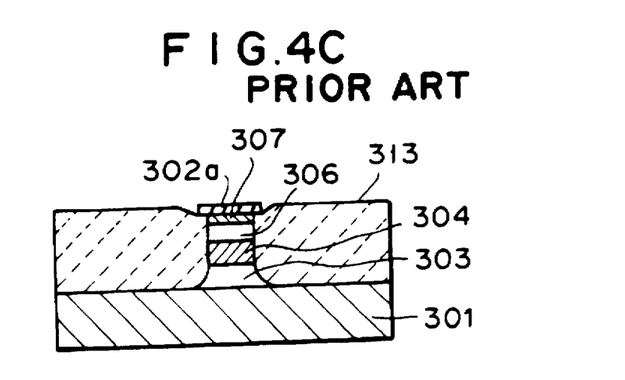
FIG. 4C is a cross-sectional view showing the fabricating process as disclosed in the second prior art.

FIGS. 4A to 4C are perspective views showing a series of fabrication processes, and a cross-sectional view of a fabricated semiconductor device.

First, as shown in FIG. 4A, a pair of SiO₂ films 302 (whose mask width is in the range of several tens to several hundreds µm) which will act as growth-prohibiting masks are formed away from each other at an interval of several tens µm, and then an optical guide layer 303, an active layer 304, a cladding layer 306 and a cap layer 307 are successively grown by the MOVPE selective growth as shown in FIG. 4B.

Next, as shown in FIG. 4c, a mesa-etching process is conducted on both a laser region and an optical modulator region with the SiO₂ film 302a as a mask to form an optical waveguide of 1.5 to 2.0 μm in width, and then an Fe-doped InP layer 313 serving as a high-resistance layer is grown at both sides of the optical waveguide with the SiO₂ film 302a as a mask, thereby burying the optical waveguide.

As described above, the second prior art needs a semiconductor etching process for forming the optical waveguide, and this etching process requires a severe control operation in the fabricating process, so that the yield is reduced.

Further, Kato, et al. has reported another method of fabricating an integrated light source comprising a DFB (Distributed Feedback) laser and an optical modulator as "DBF-LD/MODULATOR INTEGRATED LIGHT SOURCE BY BANDGAP ENERGY CONTROLLED SELECTIVE MOVPE" in "ELECTRONICS LETTERS", Vol.28, No. 2, pp 153–154 issued in 1992 (hereinafter referred to as "third prior art").

Figure 5A:
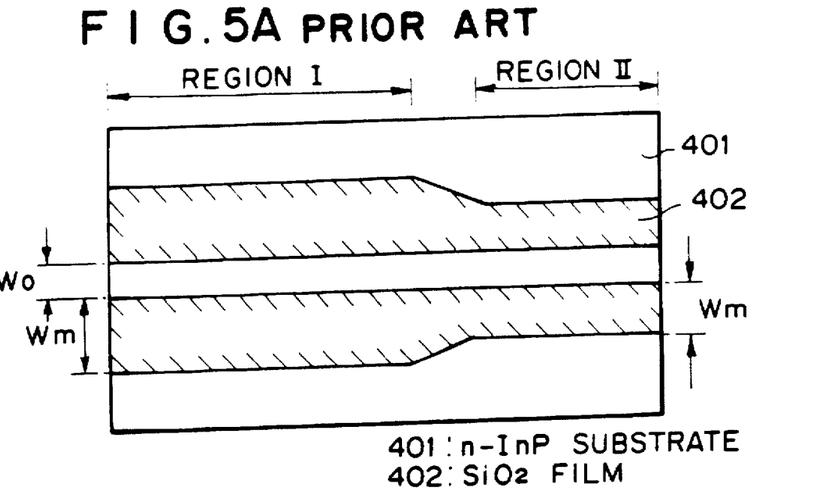
FIG. 5A is a plan view showing a growth-prohibiting mask used in a third prior art.

In the third prior art as shown in FIG. 5A, a growth-prohibiting mask having an opening width of 2 μm is formed over a region I where the DFB laser will be formed, and a region II where the optical modulator will be formed. That is, a common SiO₂ layer 402 is formed in both the regions I and II on an n-InP substrate 401. In this case, the mask width Wm is set to be larger in the region I than in the region II. Subsequently, an optical guide layer, a multiquantum well (MQW) layer and a p-InP layer are formed by the MOVPE selective growth.

Figure 5B:
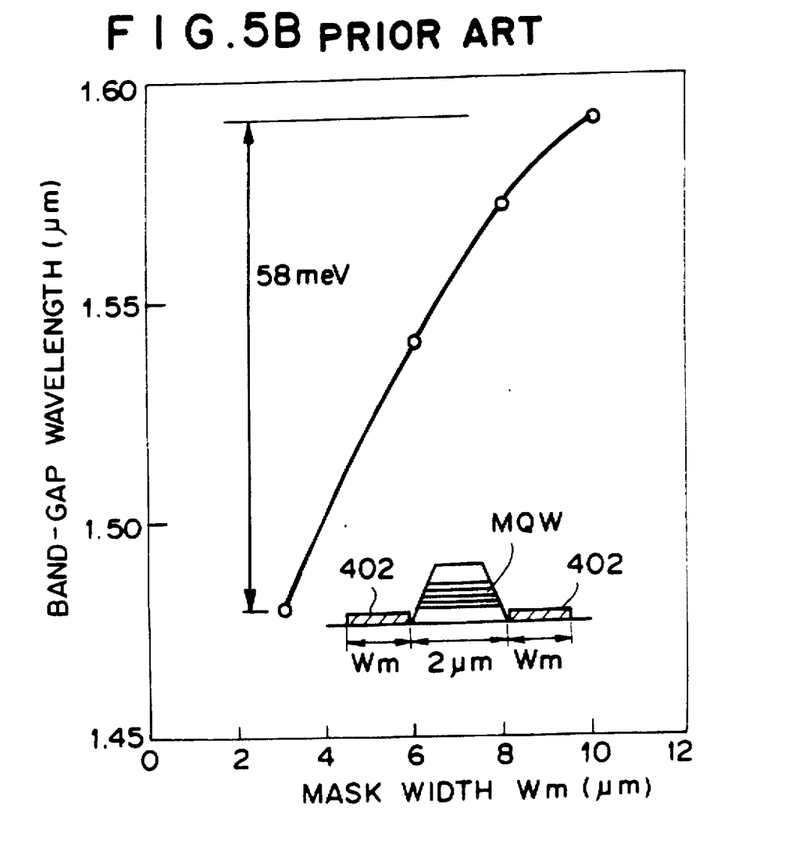
FIG. 5B is a graph showing an action of the third prior art.

According to this prior art, the band gap of the optical waveguide can be controlled by varying the mask width of the growth prohibiting mask at the time of the MOVPE selective growth as shown in FIG. 5B, and by actively using the above advantage, the linkage structure of the DFB laser and the optical modulator which has substantially 100% optical coupling efficiency can be achieved through only a single growth process.

Further, according to the third prior art, the optical waveguide is directly formed by the MOVPE selective growth method, and thus a process of forming the optical waveguide through the mesa-etching process of the semiconductor is unnecessary. Therefore, the fabricating process of the integrated optical semiconductor device can be simplified, and thus the optical device can be fabricated with high controllability and high reproducibility.

However, the first to third prior arts have the following problems.

As described above, in the first prior art reported by Sasaki, et al., a "patching" manner which includes the selective etching process and the selective re-growth (embedding re-growth) process is used to form plural regions having different band gaps. Therefore, a severe process management is required to match the wavelengths with each other, and thus the reproducibility is low. Further, plural optical waveguide regions are formed by individual epitaxial growth processes, and thus the number of the processes is increased. Accordingly, this prior art has a problem that the yield is low.

On the other hand, in the second prior art, two regions having different bandgaps can be simultaneously formed by only a single epitaxial growth process, so that the number of processes can be reduced and the yield can be enhanced. However, the mesa-etching process is indispensable to achieve an optical waveguide acting in a transverse fundamental mode, and thus it is difficult to improve the reproducibility. Accordingly, this prior art has a problem in uniformity of products.

Further, in the third prior art, the selectively grown active layer is directly used as an optical waveguide, and thus the problems of the first and second prior arts are basically avoidable. However, this prior art has the following problem. That is, when a semiconductor laser and an optical waveguide are monolithically integrated, the transmission loss of the optical waveguide is required to be suppressed as much as possible. The transmission loss of the optical waveguide must be sufficiently suppressed for the following reason.

That is, in order to realize the wavelength division multiplexing (WDM) communication, plural semiconductor laser beams which are emitted at different wavelengths are required to be incident into a single optical fiber. Further, in order to realize this system with a monolithic optical semiconductor device, it is desired that the plural laser beams are joined into one beam for one optical waveguide and then coupled to an optical fiber. In this case, in order to reduce each laser driving current to a small value and thus reduce power demand, it is indispensable to suppress the loss of the waveguide as much as possible. In the third prior art, the optical waveguide of the optical modulator is formed of a material having a larger bandgap than the laser portion to suppress light absorption due to the bandgap and thus reduce the transmission loss. However, this prior art has no or little consideration on loss factors other than the light absorption, and thus it cannot sufficiently suppress the transmission loss in the optical waveguide.

SUMMARY OF THE INVENTION

An object of the present invention is to provide a method for fabricating an optical semiconductor device in which a semiconductor laser and an optical waveguide can be integrated with reducing propagation loss of the optical waveguide and with high optical coupling efficiency, high reproducibility and high yield.

A method of fabricating an optical semiconductor device according to the present invention comprises: a first step of forming a pair of growth-prohibiting masks in a first conductivity type semiconductor layer on the surface of an optical semiconductor substrate so as to sandwich a stripe-shaped region having a predetermined width therebetween and so that the width of each of the masks is set to a first width in a first region along an extending (waveguide) direction of the stripe-shaped region, and to a second width smaller than the first width in a second region linked to the first region, and a second step of selectively epitaxially growing an active layer containing a quantum well structure and having a critical thickness or less, and a second conductivity type semiconductor layer in turn in the stripe-shaped region, whereby a semiconductor laser and/or an optical modulator and an optical waveguide are formed at respective portions of the stripe-shaped region which are located in the first region and the second region respectively, wherein an epitaxial growth condition of the epitaxial growth step is controlled to adjust a lattice strain of the first conductivity type semiconductor layer so that a first quantum well layer in which the transition between electrons and heavy holes (electron-heavy hole transition) acts as the fundamental transition and a second quantum well layer in which the transition between electrons and light holes (electron-light hole transition) acts as the fundamental transition are formed at the portions in the stripe-shaped region which are located in the first and second regions respectively.

In the fabricating method as described above, the lattice strain may be set to a positive value for the first quantum well layer and to a negative value for the second quantum well layer.

In the fabricating method as described above, the first quantum well layer may have such a lattice constant that it is lattice-matched with the first conductivity type semiconductor layer, and the lattice strain of the second quantum well layer may be set to a negative value.

Further, the lattice strain of each of the first quantum well layer and the second quantum well layer may be set to a negative value.

The quantum well layer may be formed of at least ternary (III–V) group compound semiconductor, and the barrier layer in the quantum well structure may be formed of quaternary (III–V) group compound semiconductor. In this case, the (III–V) group compound semiconductor is preferably formed of $In_{1-x}Ga_xAs_yP_{1-y}$, (0<x<1, 0<y≦1).

The epitaxial growth method is preferably a metal-organic vapor phase epitaxy (MOVPE) method.

According to the fabricating method of the optical semiconductor device of the present invention, the lattice strain of the quantum well layer can be controlled in accordance with the width of the growth-prohibiting mask, and thus the bandgap and the fundamental mode of the electron-hole transition can be controlled in accordance with the width of the growth-prohibiting mask.

In the semiconductor laser and the optical modulator, the transition between electrons and heavy holes (electron-heavy hole transition) acts as the fundamental transition, and thus the TE mode becomes the fundamental mode. On the other hand, in the optical waveguide the transition between electrons and light holes (electron-light hole transition) acts as the fundamental transition, and the TM mode becomes the fundamental mode.

DETAILED DESCRIPTION OF THE PREFERRED EMBODIMENTS

Preferred embodiments according to the present invention will be described hereunder with reference to the accompanying drawings.

Figure 6A:
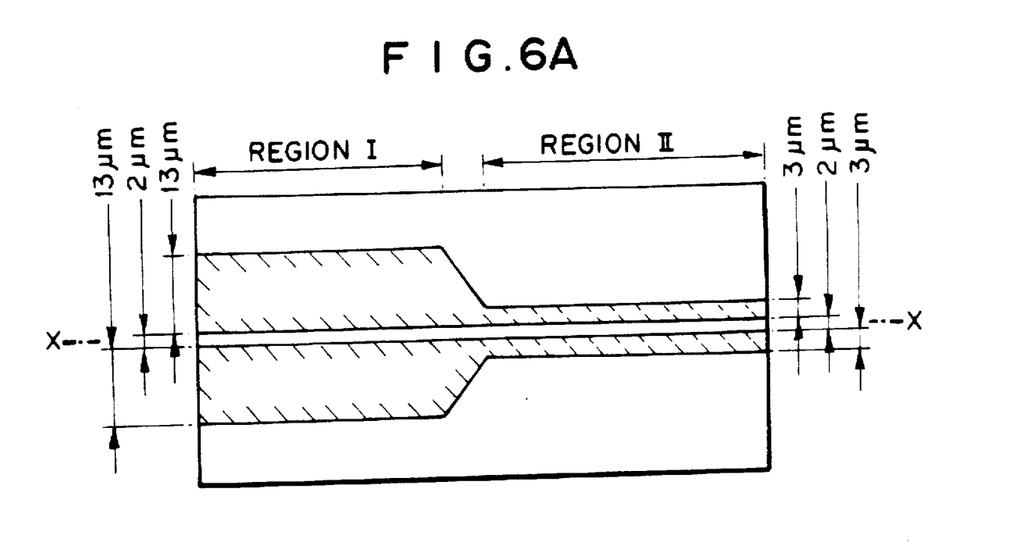
FIG. 6A is a plan view showing the outline of a growth-prohibiting mask of the present invention.
Figure 6B:
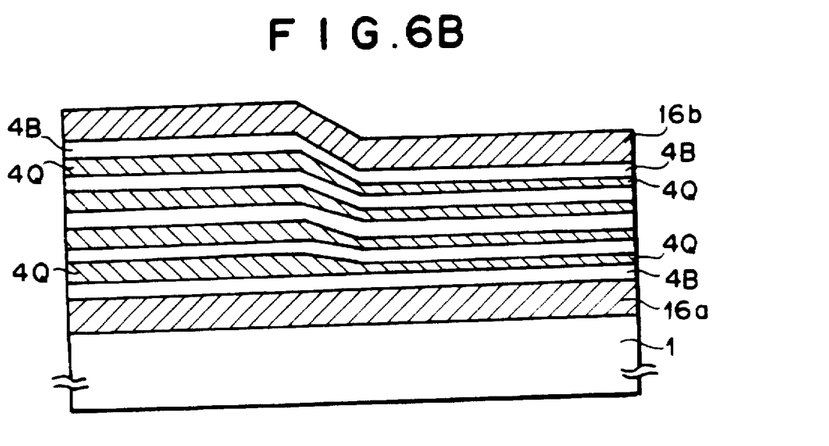
FIG. 6B is a cross-sectional view of an MQW structure which is taken along a line X—X of FIG. 6A.

FIG. 6A shows mask patterns used in MOVPE (Metalorganic Vapor Phase Epitaxy) selective growth. A region I corresponds to a laser portion, and a region II corresponds to an optical waveguide. The width of each mask pattern is set to a large value (13 µm) in the laser portion (the mask at this portion is hereinafter referred to as "wide mask"), and to a small value (3 µm) in the optical waveguide portion (the mask at this portion is hereinafter referred to as "narrow mask"). A region which is sandwiched between the mask patterns in the regions I and II corresponds to a stripe-shaped region. The stripe-shaped region has a width of 2 µm, and a MQW (Multiquantum well) structure comprising InGaAsP (λgb=1.13 µm) barriers 4B/InGaAsP quantum layers 4Q is selectively grown in the stripe-shaped region. FIG. 6B shows the sectional structure of FIG. 6A, which is taken along a line X—X. The thickness of the InGaAsP quantum well layer 4Q (grown on such a condition that an InGaAsP (λgb=1.6 µm) layer which is lattice-matched with InP is formed when the width of the growth-prohibiting mask is set to 6 µm) is set to 10 nm in the region I and to 7 nm in the region II. Each of reference numerals 16a and 16b represents an InGaAsP separate confined heterostructure (SCH) layer.

The bandgap wavelength of each region of the InGaAsP quantum well layer 4Q is measured to be 1.563 µm in the region I and 1.398 µm in the region II by a micro-area photoluminescence measurement. At this time, the lattice strain of the quantum well layer in each region is estimated to be +0.2% in the region I and –0.6% in the region II.

Figure 7:
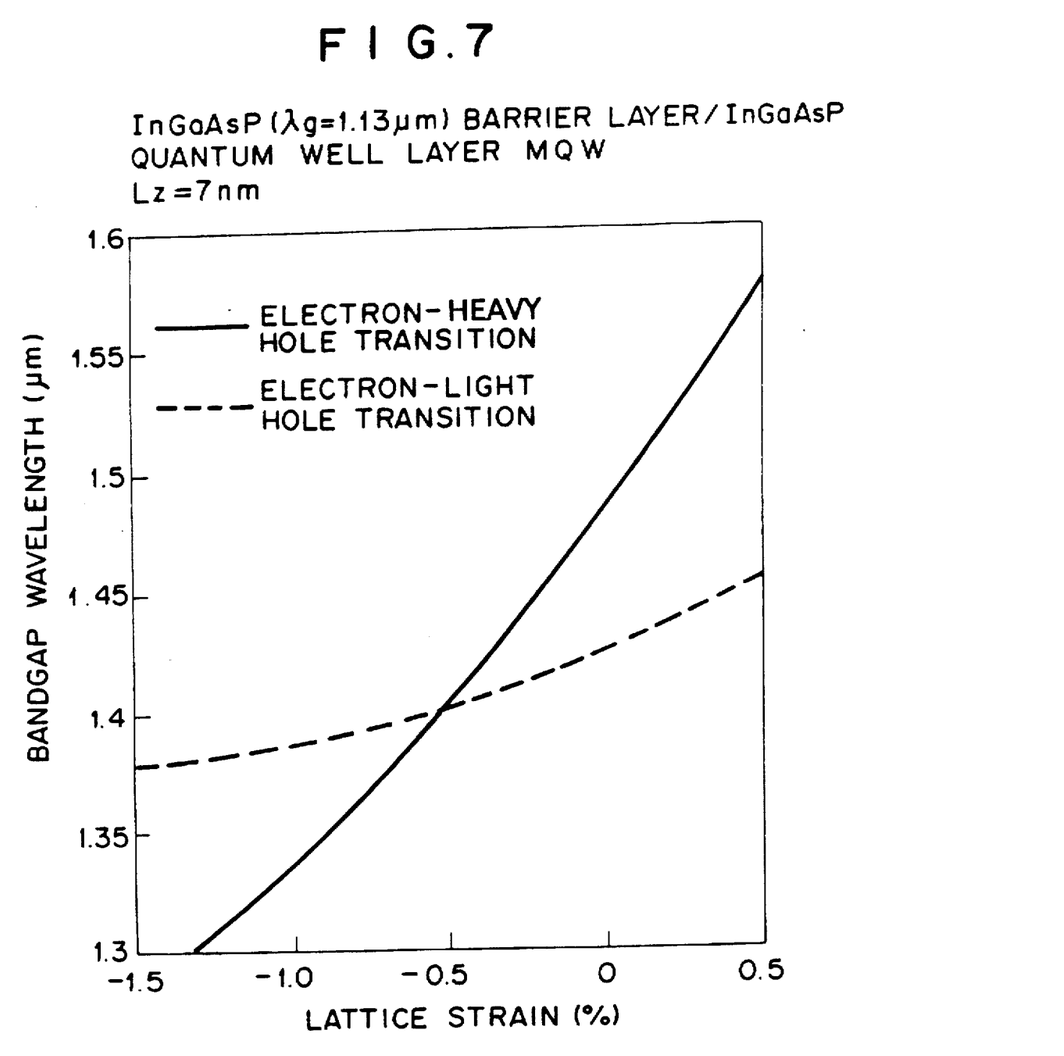
FIG. 7 is a graph showing an action of the present invention.

The lattice strain of the quantum well layer when an InGaAsP (λgb=1.6 µm) layer of 7 nm in thickness is used as the quantum well layer and an InGaAsP (λgb=1.13 µm) layer is used as the barrier layer is set to a reference value (the lattice strain of the quantum well laser is equal to zero), and the values of the bandgap wavelength in accordance with variation of the lattice strain of the quantum well layer is calculated to obtain a result shown in FIG. 7.

FIG. 7 shows a graph showing the bandgap wavelength of first level for each of the electron-heavy hole transition (e-hh) and the electron-light hole transition (e-lh). It is known that both the bandgap wavelengths based on the transition (e-hh) and the transition (e-lh) lengthen as the lattice strain increases. It is apparent from FIG. 7 that the curve of the electron-heavy hole (e-hh) transition and the curve of the electron-light hole (e-lh) transition are intersected to each other at a lattice strain of –0.55%. In other words, the (e-lh) transition acts as the fundamental transition in a lattice-strain range below –0.55%, and the (e-hh) transition acts as the fundamental transition in a lattice-strain range above –0.55%.

Accordingly, the TE mode based on the (e-hh) transition is the fundamental mode in the region I, and the TM mode based on the (e-lh) transition is the fundamental mode in the region II.

Therefore, a TE-polarized beam which is emitted from the laser portion in the region I is not absorbed in the optical waveguide region of the region II, and thus there is no absorption loss. In addition, if the side wall of the waveguide formed by the selective growth is designed as a smooth (111)B plane, a scattering loss can be suppressed to an extremely small value. Therefore, the transmission loss of the optical waveguide can be reduced at maximum with the two effects as described above.

Further, the MQW structure is continuously extended over the laser portion in the region I and the optical waveguide in the region II, so that the optical coupling efficient can be set to substantially 100%.

Next, the principle of the fabricating method of the present invention will be described.

As described in the third prior art, when the MQW structure is selectively grown by the MOVPE method, the bandgap wavelength lengthens (the bandgap energy is reduced) as the mask width increases for the following reason.

[INCREASE OF GROWTH RATE]

The growth rate is increased in the region sandwiched between the wide growth-prohibiting masks than in the region sandwiched between the narrow growth-prohibiting masks. The increase of the growth rate is based on the following mechanism or factors. At first, material species which are supplied onto the growth-prohibiting masks migrate along the surface of the growth-prohibiting masks and reach the growth region. Secondly, the material species are diffused due to concentration gradient in vapor phase. That is, the material species are consumed in the growth region while they are not consumed in the growth-prohibiting mask region, and thus there occurs concentration gradient in vapor phase. As a result, the material species are diffused from the growth-prohibiting mask region into the growth region to more enhance the growth rate in the region sandwiched between the wide growth-prohibiting masks. The above two factors contribute to the increase of the growth rate, however, particularly the second factor of the vapor-phase diffusion mainly contributes to the increase of the growth rate.

[VARIATION OF COMPOSITION]

Composition variation is caused mainly by variation of group-III material species (In and Ga in InGaAsP group). The variation of the group-III composition occurs due to the following factors.

The selective growth is performed by diffusion of the material species in vapor phase, and there occurs a difference in decomposition rate or diffusion speed between In containing species and Ga containing species during the vapor-phase diffusion, so that the concentration ratio of In and Ga varies during the vapor-phase diffusion from the growth-prohibiting mask region into the growth region. Therefore, variation of the mask width causes variation of the concentration ratio of In and Ga which are supplied to the growth region. Specifically, as the mask width is large, the concentration ratio of In increases. Accordingly, the crystal lattice constant of InGaAs or InGaAsP is increased, and the bandgap energy is reduced (the bandgap wavelength lengthens).

As described above, when the MQW structure is selectively grown by the MOVPE method, the bandgap wavelength is longer and the lattice constant is larger in the wide mask region than in the narrow mask region. Accordingly, such a structure as has an tensile strain in a short bandgap-wavelength region and a compressive strain in a long bandgap-wavelength region can be achieved by using the MOVPE selective growth.

EMBODIMENTS

[First Embodiment]

Figure 8:
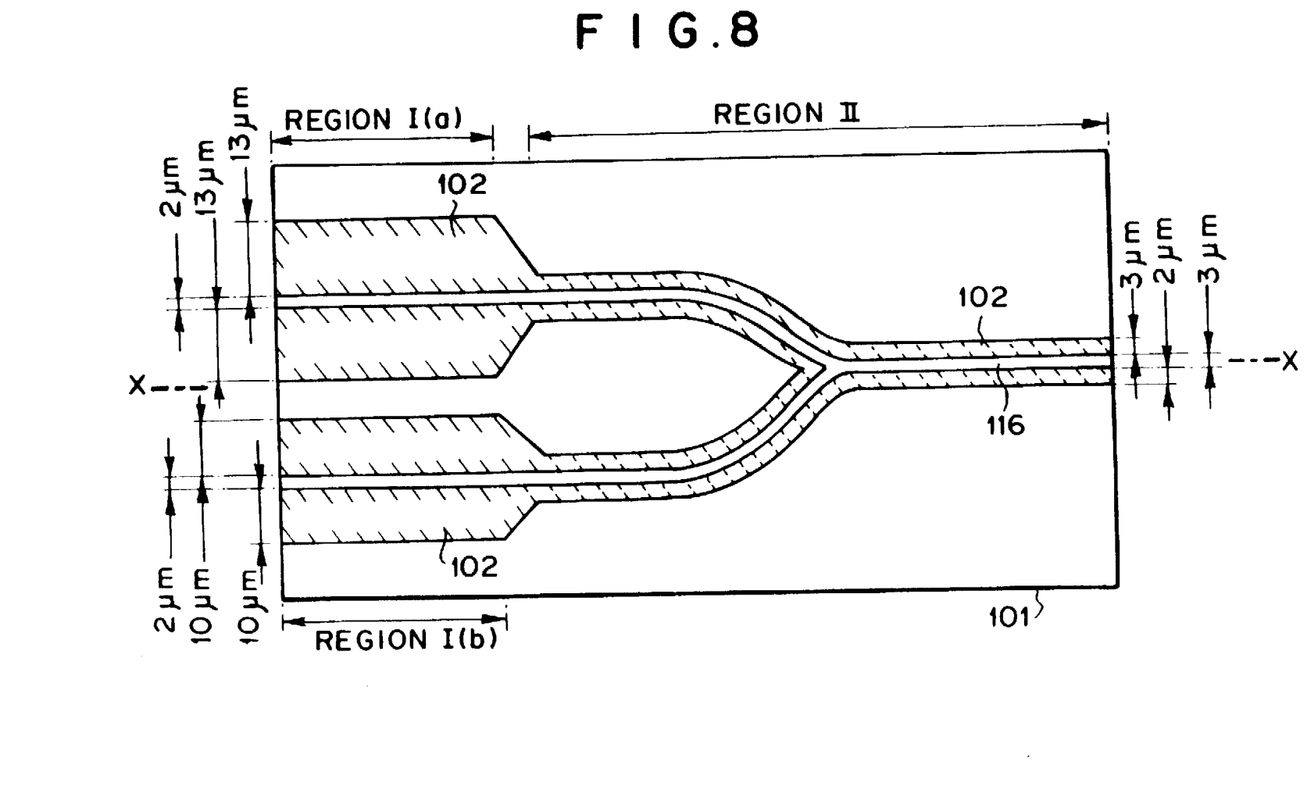
FIG. 8 is a plan view showing a growth-prohibiting mask used in a first embodiment of the present invention.
Figure 9A:
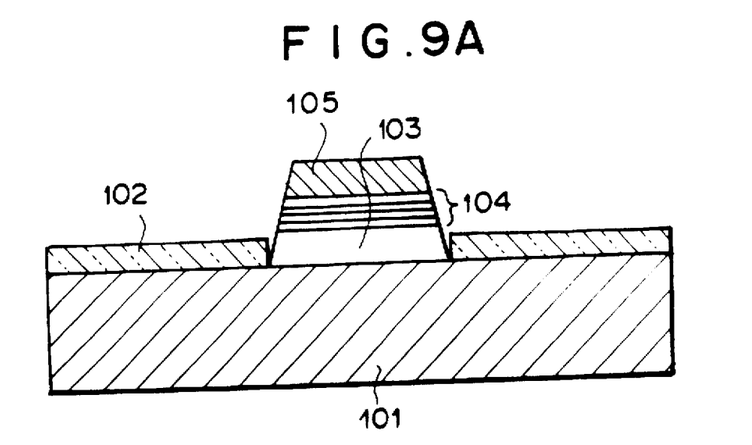
FIGS. 9A and 9B are cross-sectional view showing a series of processes for fabricating an optical semiconductor device in the first embodiment.
Figure 9B:
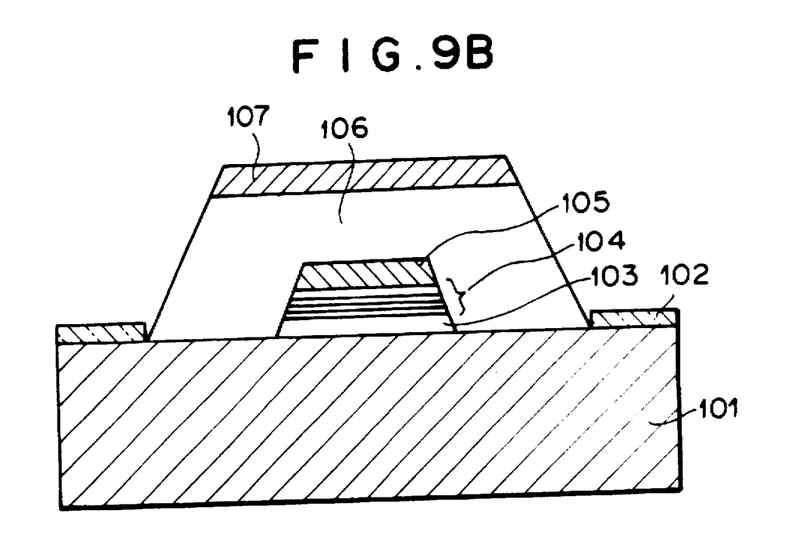
Figure 10:
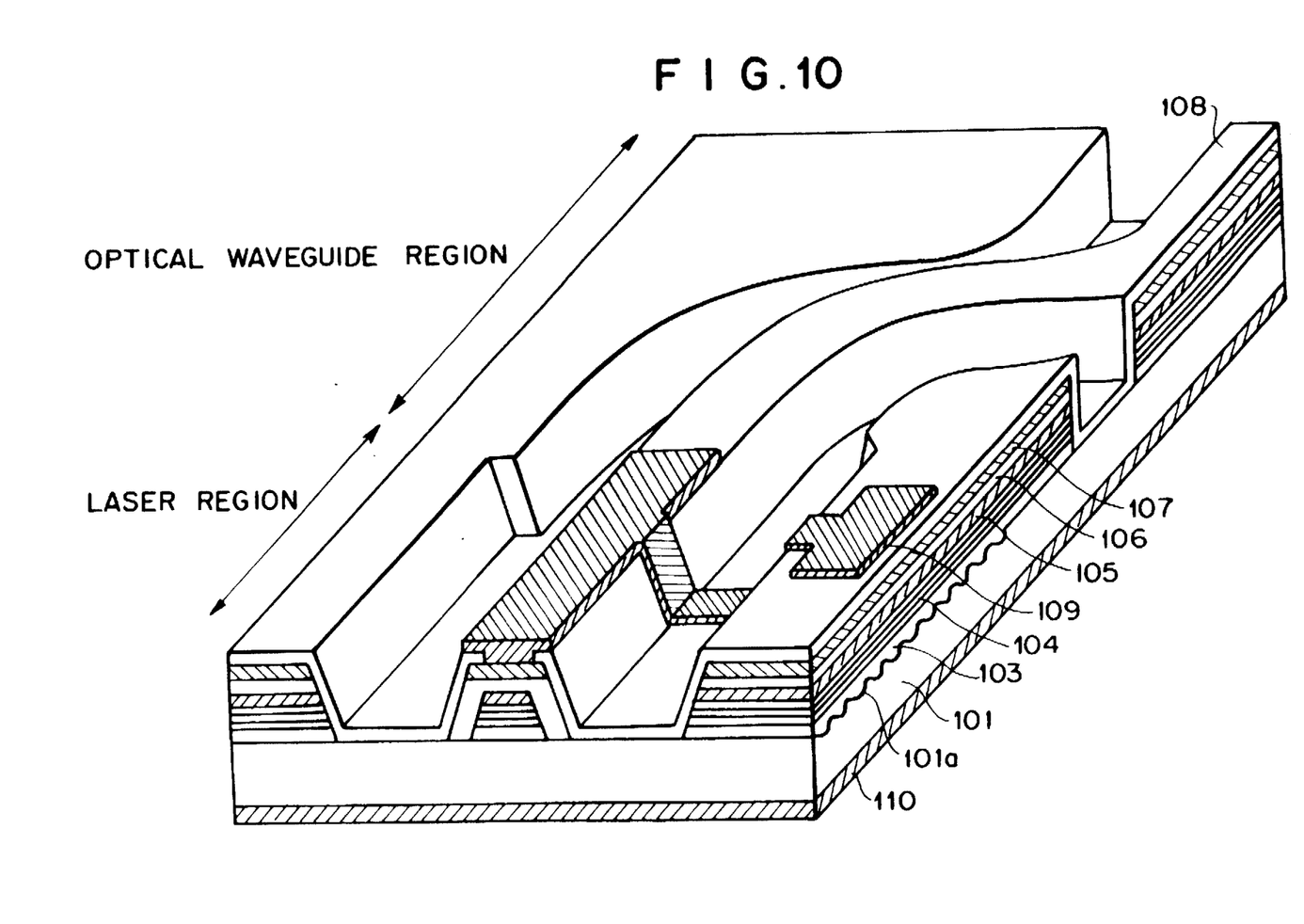
FIG. 10 is a perspective view, partially containing a cross-sectional view, which shows the optical semiconductor device of the first embodiment according to the present invention.

A first embodiment according to the present invention will be described with reference to FIGS. 7 to 10, wherein FIG. 8 is a plan view showing a growth-prohibiting mask pattern used in the first embodiment, FIGS. 9A and 9B are cross-sectional views showing a series of processes of the first embodiment, and FIG. 10 is a perspective view, partially containing a cross-sectional view (taken along a line X—X) in FIG. 8, which shows a WDM light source having a semiconductor laser and an optical waveguide which are integrated on the same substrate.

First, a grating 101a whose period is equal to 240 nm is formed in a region (regions I(a), I(b) in FIG. 8 where laser portions will be formed) on an n-InP substrate 101 whose surface corresponds to (100) plane as shown in FIG. 10, and then growth-prohibiting masks which are formed of $SiO_2$ films 102 each having 100 nm thickness are formed so as to sandwich a stripe-shaped region 116 having a width of 2 µm therebetween as shown in FIG. 8. The length and width of each growth-prohibiting masks are set to 1000 µm and 3 µm in the region II, 300 µm and 13 µm in the region I(a) and 300 µm and 10 µm in the region I(b), respectively. The extending direction (waveguide direction) of a linear portion of the stripe-shaped region 116 corresponds to <011>. Subsequently, an optical guide layer 103 which is formed of InGaAsP (λgb=1.2 µm) and has a thickness of 0.1 µm is formed by the MOVPE method. The growth temperature and the growth pressure are set to 625° C. and 100 hPa respectively, and the flow amount is set to 142 ml/min for trimethyl indium (TMIn), 32 ml/min for triethyl gallium (TEGa), 11 ml/min for arsine ($AsH_3$) and 62 ml/min for phosphine ($PH_3$). InGaAsP (λgb=1.2 µm) layers having the same thickness and composition are formed on those portions which are not covered with the $SiO_2$ films 102.

Subsequently, an MQW (multiquantum well) layer 104 is formed on the optical guide layer 103. The MQW layer 104 comprises InGaAsP quantum well layers and InGaAsP (λgb=1.15 µm) barrier layers of 8 nm thickness which are alternately and repetitively laminated on each other at a repetitive period of 5. When the InGaAsP quantum well layer is formed, the flow amount is set to 142 ml/min for TMIn, 80 ml/min for TEGa, 117 ml/min for $ASH_3$ and 58 ml/min for $PH_3$. These values are based on such a condition that an InGaAsP (λgb=1.6 µm) layer having no lattice strain is formed when the width of the growth-prohibiting mask is set to 6 µm.

Therefore, this InGaAsP layer is actually grown in the stripe-shaped region while the composition and thickness thereof vary in the regions I(a), I(b) and II as described later. The flow amount at the formation of the InGaAsP (λgb= 1.15µ) barrier layers is set to 142 ml/min for TMIn, 23 ml/min for TEGa, 7 ml/min for $AsH_3$ and 58 ml/min for $PH_3$, and the composition and the thickness of the barrier layer are little varied over the whole stripe-shaped region 116.

Subsequently, a p-InP layer 105 of 0.1 µm thickness is formed. The flow amount is set to 375 ml/min for TMIn and 125 ml/min for $PH_3$. Through the above processes, the mesa type multi-layer structure (whose side facet corresponds to (111)B plane) which comprises the optical guide layer 103, the MQW active layer 104 and the p-InP layer 105 is formed as shown in FIG. 9A.

Subsequently, the $SiO_2$ films 102 are etched to increase the width of the stripe-shaped region by about 3.5 to 4 µm, and then a p-InP cladding layer 106 of 1.5 µm thickness and a p-InGaAsP ($\lambda$gb=1.67) cap layer 107 of 0.2 µm thickness are selectively grown as shown in FIG. 9B.

The bandgap wavelength Ag of the InGaAsP quantum well layer thus formed is measured to be 1.56 µm (10 nm in thickness) in the region I(a), 1.54 µm (9 nm in thickness) in the region I(b) and 1.39 µm (7 nm in thickness) in the region II by the micro-area photoluminescence measurement. The lattice strain which is calculated on the basis of the thickness observed by SEM (scanning electron microscope) and the bandgap wavelength is equal to +0.2% in the region I(a), +0.18% in the region I(b) and −0.6% in the region II. The critical thickness hc of the InGaAsP layer for the lattice strain of ±0.6% is equal to 45 nm (when the thickness exceeds the critical thickness hc, crystal defect such as dislocation or the like occurs and the strain is moderated), no crystal defect occurs in the MQW structure. As described above, the portions other than the InGaAsP quantum well layers are lattice-matched with InP within ±0.05%.

Finally, an $SiO_2$ film 108 is deposited, contact holes are formed at desired positions and an p-side electrode 109 and an n-side electrode 110 are formed to obtain the WDM light source in which the laser and the optical waveguide are integrated.

The device is designed so that the length of the laser side is equal to 300 µm and the length of the optical waveguide is equal to 1000µ. As not shown, a high reflection film (reflectivity of 80%) is coated on the end facet of the laser side, and a low reflection film (reflectivity of 0.1%) is coated on the end facet of the optical waveguide side. The device thus formed was estimated as follows. A laser oscillation (emission) threshold value was equal to 10 mA for both the lasers in the regions I(a) and I(b), and the output power of light emitted from the optical waveguide at an operating current of 100 mA was equal to 10 mW. The oscillation wavelength was equal to 1.552 µm in the region I(a), and 1.557 µm in the region I(b).

Only the linear portion of the region II (optical waveguide) was cut out, and TE-polarized light having a wavelength near to 1.555 µm was irradiated into the linear portion of the optical waveguide to measure the transmission loss of the optical waveguide. As a result, the propagation loss was equal to a very low value of 0.3 dB/cm, and this is dependent on the following factors. That is, the TM mode is the fundamental mode in the optical waveguide region and thus the TE-polarized light is not absorbed in the optical waveguide region (no absorption loss occurs). In addition, the side surface of the optical waveguide which is formed by the selective growth corresponds to the (111)B plane, so that the scattering loss is extremely reduced.

[SECOND EMBODIMENT]

A second embodiment according to the present invention will be described with reference to FIGS. 11 and 12.

Figure 11:
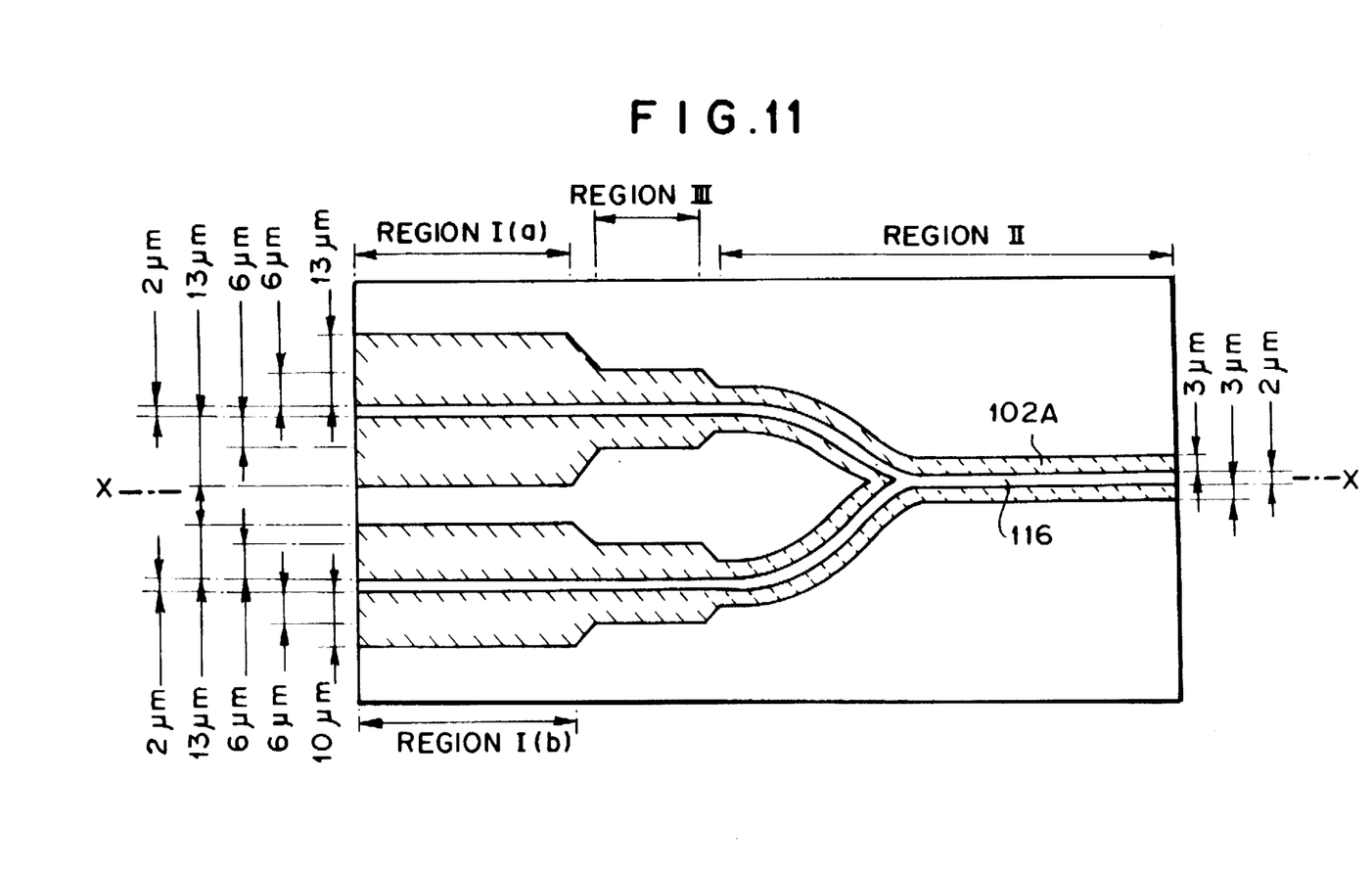
FIG. 11 is a plan view showing a growth-prohibiting mask used in a second embodiment of the present invention.
Figure 12:
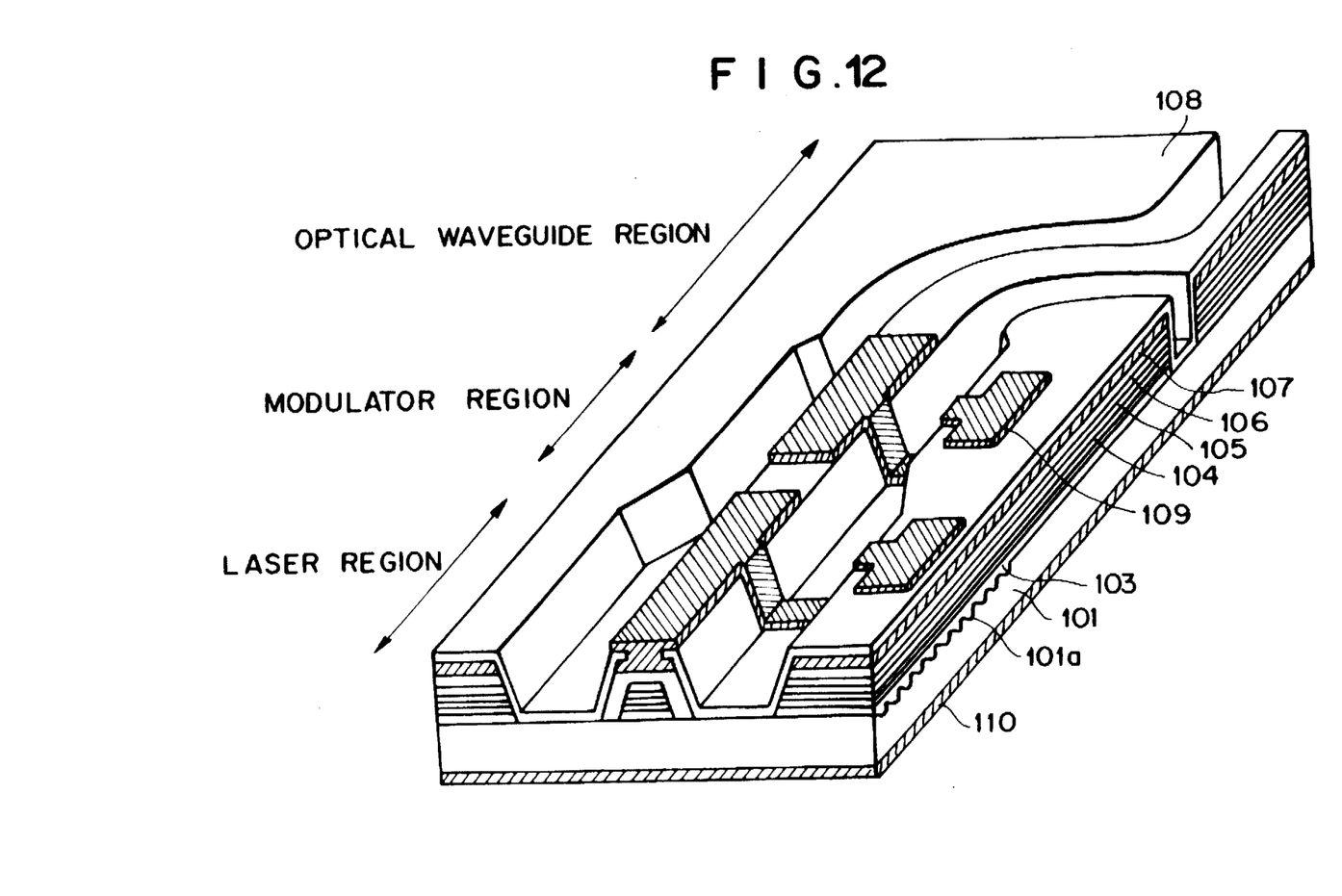
FIG. 12 is a perspective view, partially containing a cross-sectional view, which shows an optical semiconductor device of the second embodiment according to the present invention.

FIG. 11 is a plan view showing a growth-prohibiting mask pattern used in the second embodiment of the present invention, and FIG. 12 is a perspective view, partially containing a cross-sectional view (taken along a line X—X in FIG. 11), which shows an optical modulator built-in type WDM light source having integrated semiconductor laser, electroabsorption type optical modulator, and an optical waveguide which is fabricated according to the second embodiment. In this embodiment, an optical modulator is provided between a semiconductor laser and an optical waveguide.

First, a grating 101a whose period is equal to 240 nm is formed in a region (regions I(a), I(b) in FIG. 11 where laser portions will be formed) on an n-InP substrate 101 whose surface corresponds to (100) plane as shown in FIG. 12, and then growth-prohibiting masks which are formed of $SiO_2$ films 102 each having 100 nm thickness are formed so as to sandwich a stripe-shaped region 116 having a width of 2 µm therebetween as shown in FIG. 11.

$SiO_2$ films 102A are formed on the substrate. Each $SiO_2$ film 102A has the same design as the $SiO_2$ film 102 shown in FIG. 8 except that a growth-prohibiting mask having a length of 150 µm and a width of 6 µm is further provided in a region III between the region I(a), I(b) and the region II. Subsequently, in the same manner as the first embodiment, the optical guide layer 103 formed of InGaAsP ($\lambda$gb=1.2 µm) and having a thickness of 0.1 µm thickness, the MQW active layer 104 comprising the InGaAsP quantum well layers and the InGaAsP ($\lambda$gb=1.15 µm) barrier layers which are alternately and repetitively laminated on each other at a repetitive period of 5, and the p-InP layer 105 of 0.1 µm thickness are selectively grown by the MOVPE method. Subsequently, a part of the $SiO_2$ films 102A is removed to increase the opening width, and then the p-InP cladding layer 106 of 1.5 µm thickness and the p-InGaAs cap layer 107 of 0.2 µm thickness are selectively grown.

The bandgap wavelength of the selectively grown layer thus formed is measured to be 1.56 µm (10 nm in thickness) in the region I(a), 1.54 µm (9 nm in thickness) in the region I(b), 1.49 µm (8 nm in thickness) in the region III, and 1.39 µm (7 nm in thickness) in the region II by the micro-area photoluminescence measurement. The lattice-strain which is calculated on the basis of the thickness observed by the SEM (scanning electron microscope) and the bandgap wavelength is calculated to be +0.2% in the region I(a), +0.38% in the region I(b), 0.0% in the region III, and −0.6% in the region II. Since the critical film thickness for the lattice strain of ±0.6% is equal to 45 nm, no crystal defect occurs in the MQW structure.

Finally, the electrode formation process is performed to obtain the optical modulator built-in type WDM light source in which the laser, the optical modulator and the optical waveguide are integrated as shown in FIG. 12. The gain/loss mode in the quantum well layer of the laser region and the optical modulator region is the TE mode, and that in the quantum well layer of the optical waveguide region is the TM mode, so that the coupling efficiency is high and the transmission loss can be reduced., The above description is made to the case where each of the quantum well layer and the barrier layer is formed of a quaternary compound of In-Ga-As-P, however, various materials may be used for the MQW structure. For example, the quantum well layer may be formed of a ternary compound of In-Ga-As while the barrier layer is formed of a quaternary compound of In-Ga-As-P. Further, the MQW structure may be formed by using a ternary or binary compound of Al, Ga, and As.

Further, with respect to the crystal lattice strain of each region, the laser portion is set to a plus strain (compressive strain), and the optical waveguide portion is set to a minus strain (tensile strain). However, the same effect can be obtained when the lattice strain of the laser portion is set to zero or to a minus strain (tensile strain) within such a range that the TE mode oscillation is kept.

As described above, according to the present invention, the optical semiconductor device in which the semiconductor laser and/or the optical modulator and the optical waveguide are integrated, can be designed so that the MQW structure formed by the MOVPE selective growth can be directly set as an optical waveguide and the gain (loss) mode is made different in the semiconductor laser portion and/or the optical modulator and the optical waveguide. Therefore, the following effects can be obtained.

(1) The semiconductor laser and/or the optical modulator and the optical waveguide can be integrated with an optical coupling efficiency of substantially 100% because they are linked to one another through the continuous MQW structure.

(2) Since the gain (loss) mode is varied between the semiconductor laser portion and/or the optical modulator portion and the optical waveguide portion, the light beam emitted from the laser portion is not absorbed by the optical waveguide region, and thus there is no absorption loss in the optical waveguide region Further, the side facet of the waveguide formed by the selective growth can be made a smooth (111)B plane, so that the scattering loss is very small. With the above two points, reduction in the propagation loss of the optical waveguide can be promoted.

(3) Since the MQW-structure optical waveguide is directly formed by the MOVPE selective growth, no semiconductor etching process is required, so that the MQW structure can be formed with high reproducibility and high yield.

Although the present invention has been shown and described with respect to a best mode embodiment thereof, it should be understood by those skilled in the art that the foregoing and various other changes, omission, and additions in the form and detail thereof may be made therein without departing from the spirit and scope of the present invention.

What is claimed is:

1. A method of fabricating an optical semiconductor device comprising the steps of:

forming a pair of growth-prohibiting masks in a first conductivity type semiconductor layer on the surface of an optical semiconductor substrate so as to sandwich a stripe-shaped region having a predetermined width of an optical transit therebetween and so that a width of each of said masks is set to a first width in a first region along an extending direction of said stripe-shaped region, and to a second width smaller than the first width in a second region linked to the first region;

selectively epitaxially growing an active layer containing a quantum well structure and having a critical thickness or less, and a second conductivity type semiconductor layer in turn in said stripe-shaped region, whereby a semiconductor laser and/or an optical modulator and an optical waveguide are formed at respective portions of said stripe-shaped region which are located in the first region and the second region respectively, and controlling an epitaxial growth condition of said epitaxial growth step so as to adjust a lattice strain of said first conductivity type semiconductor layer so that a first quantum well layer in which transition between electrons and heavy holes acts as a fundamental transition and a second quantum well layer in which transition between electrons and light holes acts as the fundamental transition are formed at the portions in said stripe-shaped region which are located in the first and second regions respectively.

2. The fabricating method as claimed in claim 1, wherein said first and second quantum well layer is formed of at least ternary (III–V) group compound semiconductor, and a barrier layer in said quantum well structure is formed of quaternary (III–V) group compound semiconductor.

3. The fabricating method as claimed in claim 2, wherein the (III–V) group compound semiconductor is formed of $In_{1-x}Ga_xAs_yP_{1-y}$, ($0<x<1$, $0<y\leq 1$).

4. The fabricating method as claimed in claim 1, wherein the epitaxial growth is performed by a metal-organic vapor phase epitaxial growth method.

5. The fabricating method as claimed in claim 1, wherein the lattice strain is set to a positive value for said first quantum well layer and to a negative value for said second quantum well layer.

6. The fabricating method as claimed in claim 5, wherein said first and second quantum well layer is formed of at least ternary (III–V) group compound semiconductor, and a barrier layer in said quantum well structure is formed of quaternary (III–V) group compound semiconductor.

7. The fabricating method as claimed in claim 5, wherein the (III–V) group compound semiconductor is formed of $In_{1-x}Ga_xAs_yP_{1-y}$, ($0<x<1$, $0<y\leq 1$).

8. The fabricating method as claimed in claim 5, wherein the epitaxial growth is performed by a metal-organic vapor phase epitaxial growth method.

9. The fabricating method as claimed in claim 1, wherein said first quantum well layer has such a lattice constant as to be lattice-matched with said first conductivity type semiconductor layer, and the lattice strain of said second quantum well layer is set to a negative value.

10. The fabricating method as claimed in claim 9, wherein said quantum well layer is formed of at least ternary (III–V) group compound semiconductor, and a barrier layer in said first and second quantum well structure is formed of quaternary (III–V) group compound semiconductor.

11. The fabricating method as claimed in claim 10, wherein the (III–V) group compound semiconductor is formed of $In_{1-x}Ga_xAs_yP_{1-y}$, ($0<x<1$, $0<y\leq 1$).

12. The fabricating method as claimed in claim 10, wherein the epitaxial growth is performed by a metal-organic vapor phase epitaxial growth method.

13. The fabricating method as claimed in claim 1, wherein the lattice strain of each of said first quantum well layer and said second quantum well layer is set to a negative value.

14. The fabricating method as claimed in claim 13, wherein said first and second quantum well layer is formed of at least ternary (III–V) group compound semiconductor, and a barrier layer in said quantum well structure is formed of quaternary (III–V) group compound semiconductor.

15. The fabricating method as claimed in claim 14, wherein the (III–V) group compound semiconductor is formed of $In_{1-x}Ga_xAs_yP_{1-y}$, ($0<x<1$, $0<y\leq 1$).

16. The fabricating method as claimed in claim 13, wherein the epitaxial growth is performed by a metal-organic vapor phase epitaxial growth method.

17. A method of fabricating an optical semiconductor device comprising:

a first step of forming a pair of growth-prohibiting masks on a first conductivity type semiconductor layer on the surface of an optical semiconductor substrate so as to sandwich an Y-shaped bifurcated stripe region having a predetermined width of an optical transit therebetween and so that the width of each of said masks is set to first and third widths in a first region and a third region of the bifurcated portion along an extending direction of said stripe region, and to a second width smaller than the first and the third widths in a second region continuously inked to the first region; and a second step of selectively epitaxially growing an active layer containing a quantum well structure and having a critical thickness or less, and a second conductivity type semiconductor layer in turn in said stripe region, whereby a semiconductor laser and/or an optical modulator and an optical waveguide are formed at respective portions of said stripe region located in the first region and the second region respectively so as to different gain modes.

18. The fabricating method as claimed in claim 17, further comprising a third step of broadening the stripe region by etching the growth-prohibiting masks after said second step, and successively and selectively growing a cladding layer and a cap layer on the stripe region, and a second step of depositing an oxide film, forming desired contact holes and forming electrodes after said third step.

* * * * *